(12) United States Patent
Kurjanowicz

(10) Patent No.: US 6,611,062 B2
(45) Date of Patent: Aug. 26, 2003

(54) TWISTED WORDLINE STRAPPING ARRANGEMENT

(75) Inventor: Wlodek Kurjanowicz, Kanata (CA)

(73) Assignee: Atmos Corporation, Kanata (CA)

( * ) Notice: Subject to any disclaimer, the term of this patent is extended or adjusted under 35 U.S.C. 154(b) by 0 days.

(21) Appl. No.: 10/109,877

(22) Filed: Apr. 1, 2002

(65) Prior Publication Data

US 2002/0140106 A1 Oct. 3, 2002

(30) Foreign Application Priority Data

Mar. 30, 2001 (CA) ............................................. 2342496

(51) Int. Cl.$^7$ ................................................ H01L 29/94
(52) U.S. Cl. ...................................... 257/776; 257/377
(58) Field of Search ................................ 257/776, 369, 257/544, 547, 550, 377, 372

(56) References Cited

U.S. PATENT DOCUMENTS

| | | |
|---|---|---|
| 5,097,441 A | 3/1992 | Cho et al. |
| 5,933,725 A | 8/1999 | Kirsch et al. |
| 6,034,879 A | 3/2000 | Min et al. |
| 6,043,562 A | 3/2000 | Keeth |
| 6,141,236 A | 10/2000 | Kengeri |

Primary Examiner—Roy Potter

(57) ABSTRACT

A high density wordline strapping arrangement is obtained by routing three primary metal-2 wordline straps in the same space as four polysilicon wordline, and routing the fourth wordline strap in a metal-4 layer over the primary metal-2 wordline straps. Stitches in metal-3 connect metal-2 primary wordline straps to metal-4 wordline straps. Therefore, contact spacing and metal pitch limitations are relaxed to allow four metal wordline straps to occupy the same pitch as four polysilicon wordlines. The wordlines are twisted to keep the fully balanced and to minimise coupling between wordline straps and neighbouring power and signal lines. Hence, a smaller memory cell array can be formed according to the wordline packing arrangement of the present invention.

9 Claims, 6 Drawing Sheets

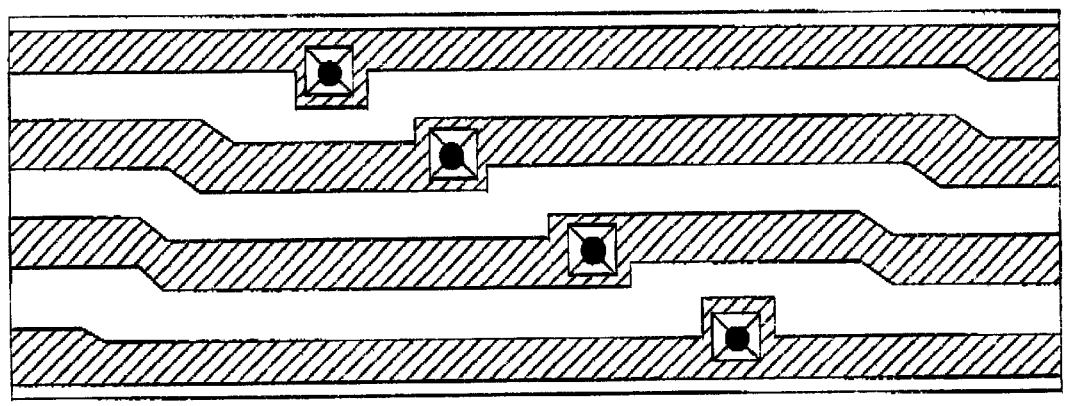
Fig. 2
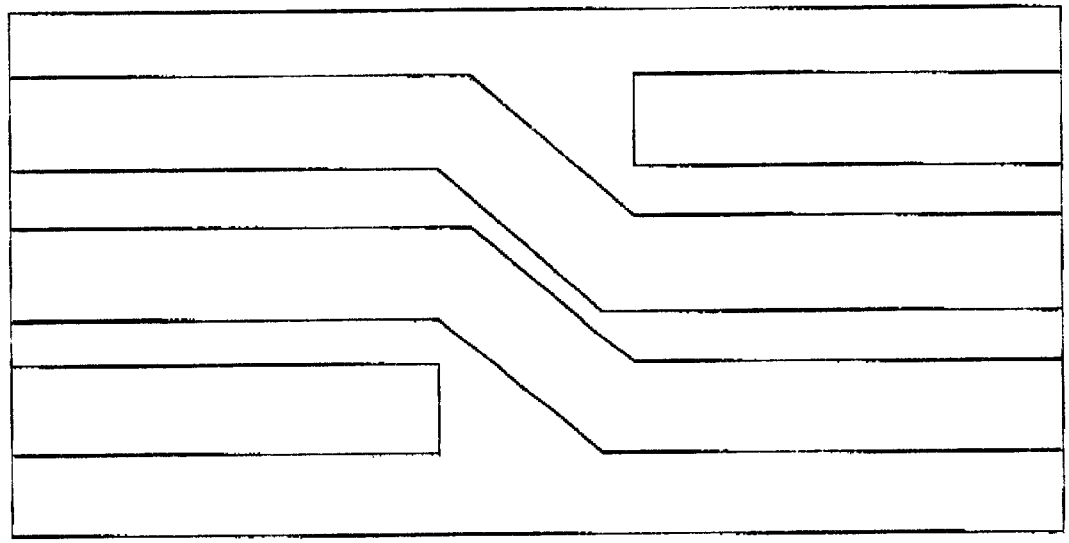
Fig. 3
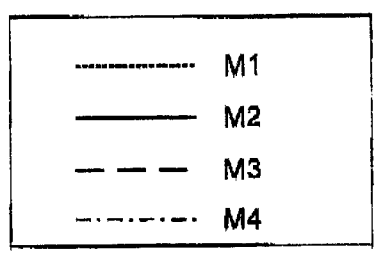

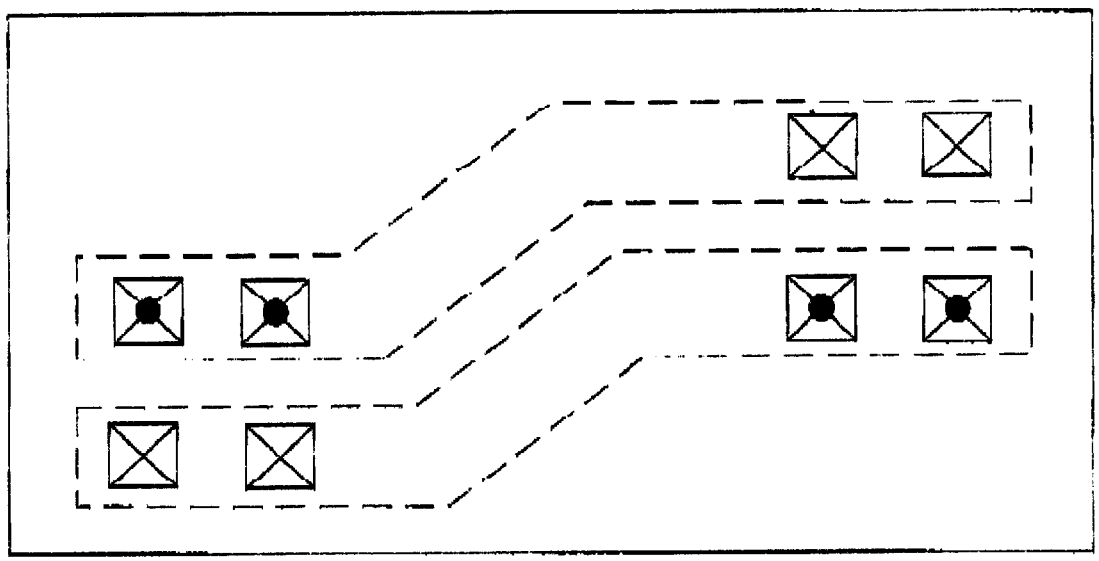
Fig. 4
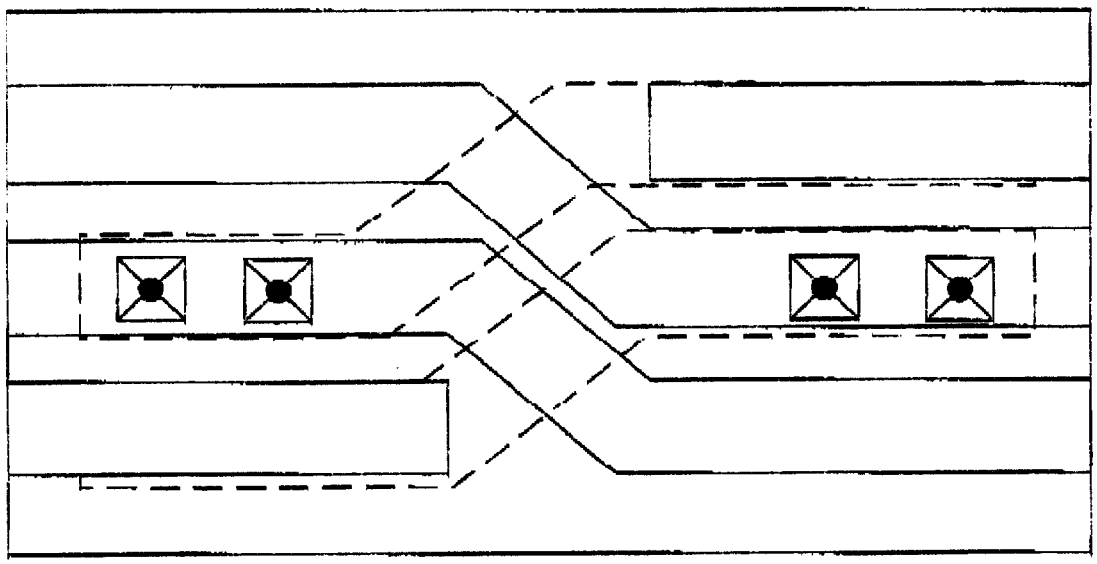
Fig. 5
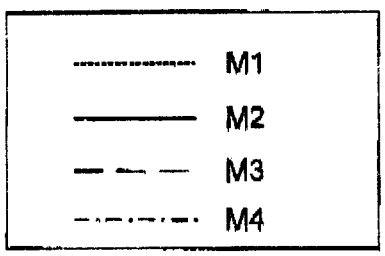

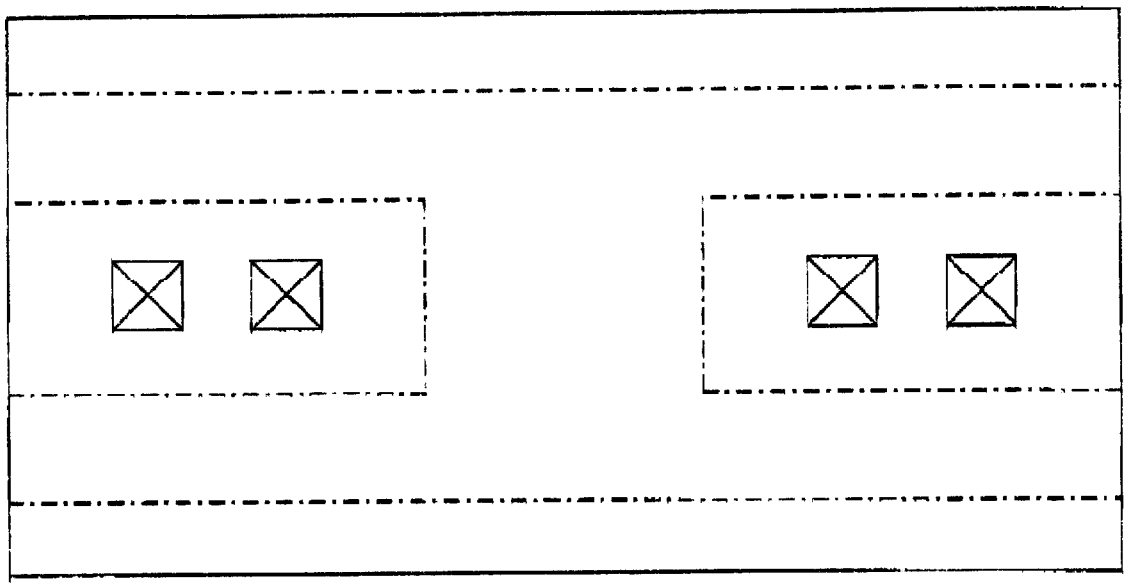
Fig. 6
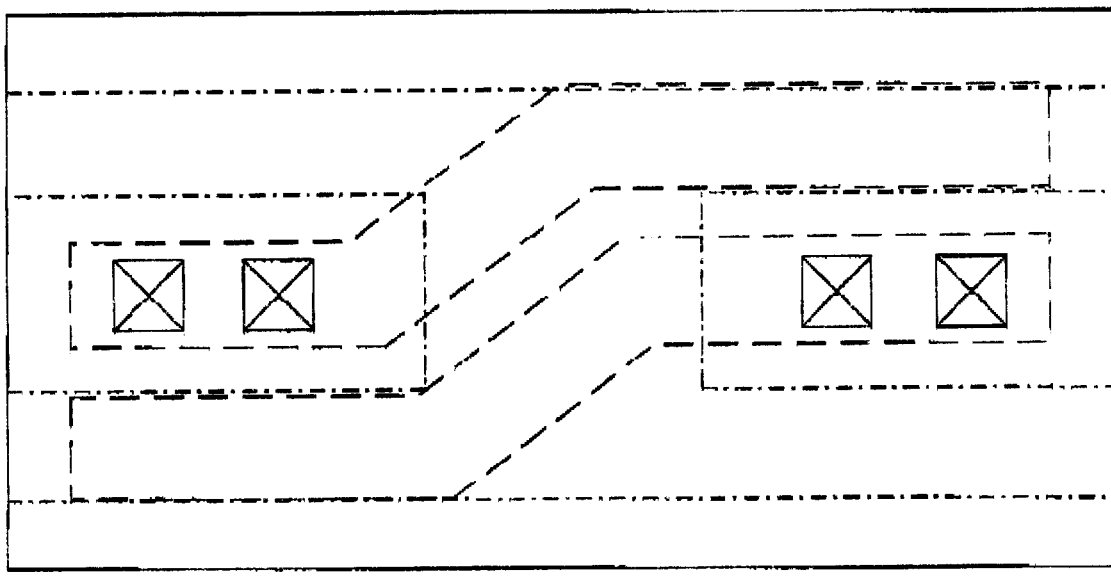
Fig. 7
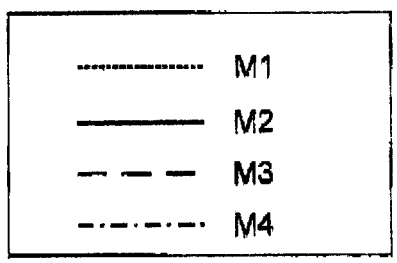

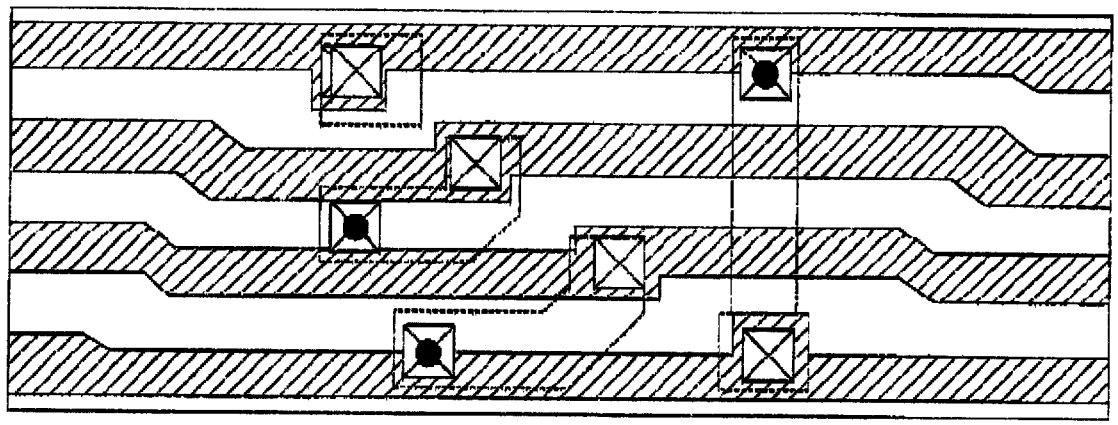
Fig. 9
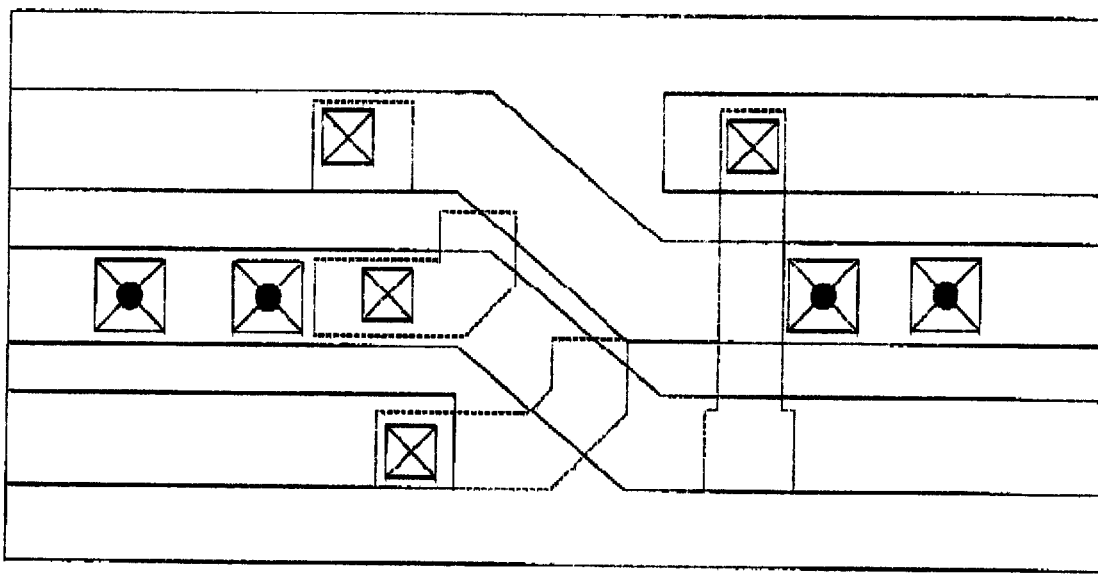
Fig. 10
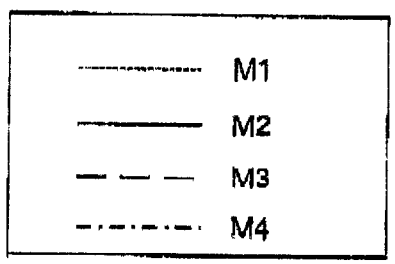

TWISTED WORDLINE STRAPPING ARRANGEMENT

This application claims priority from Canadian Patent Application No. 2,342,496, filed Mar. 30, 2001.

FIELD OF THE INVENTION

The present invention relates to semiconductor memory arrays. More particularly the invention relates to wordline strap configurations for increasing wordline packing density and reducing the size of the semiconductor memory array.

BACKGROUND OF THE INVENTION

High density memory integrated circuits, in particular dynamic random access memory (DRAM) circuits arid nonvolatile memory circuits such as flash or read only memory (ROM), contain large rectangular arrays of cells, each of which represents a single bit of memory storage. Digital information is written to and read from these cells by peripheral circuitry that addresses each cell through wordlines and bitlines. In a typical DRAM, each storage cell consists of a polysilicon gate metal oxide silicon field effect transistor (MOSFET) and a capacitor. A wordline comprises a continuous line of gate level polysilicon passing alternately over field oxide and over the channel regions of access MOSFETs in the string of memory cells addressed by the wordline. Switching a voltage signal on the wordline from a low to a high voltage turns the access MOSFETs on (for n-channel MOSFETs) and electrically connects the cell's storage capacitor to a bitline for sensing (i.e. accessing the cell). Switching from the high down to the low voltage ends the access. Hence, taking the wordline from low to high or from high to low is the critical criterion for cell access times. The performance of the DRAM array is dependent upon the speed with which these voltage transitions take place. That speed in turn depends upon the RC (resistance-capacitance) time constant of the wordline.

In order to achieve high performance, the resistive component R must be as small as possible. As a conductor polysilicon, even heavily doped, cannot compare with metals such as, for example, aluminum. Various suicides have been used in DRAM gate polysilicon technology (e.g. $WSi_x$, $TaSi_x$, $MoSi_x$) to reduce tie sheet resistance and improve wordline speed. These silicides typically have 8–15Ω/□ (ohms per square) sheet resistances. Unfortunately, the much, lower sheet resistance in in-situ formed silicides/salicides ($TiSi_x$ and $CoSi_x$) are difficult to apply to DRAM wordlines because the high temperature steps involved in DRAM cell formation cause their conductance to degrade.

As requirements on DRAM speeds have become more demanding and arrays become larger, tile need for reducing the resistivity of wordlines has become even more important. A solution that has met with considerable success is the strapping of the polysilicon wordlines with lines formed in a superjacent metal level, for example aluminum or tungsten. The selected metallization level can be any wiring level above the polysilicon wordlines except the level used to form bitlines (if metal bitlines are used). Practically, in order to avoid unnecessary interconnections, the next available higher level has been preferred. Ideally, the metal straps should be identical to maintain the same performance and behaviour across the wordline addresses.

The sheet resistances of the metal lines are tens to hundreds of mΩ/□ making them very effective in reducing the RC time constant of wordlines. The strapping is accomplished by forming a metal line in a metallization level lying directly over and running parallel with the polysilicon wordline and spaced from it by an insulative layer. Periodic contacts between the lines direct most of the current flow through the low resistance metal lines.

In conventional wordline strapping, metal lines are formed in a single metallization levels, for example a first aluminum level. The metal lines are stitched to underlying polysilicon word lines which lie directly below the metal lines, by meals of interlevel contacts or vias. The pitch of the metal lines is defined as the distance between one point on a line and a corresponding point on an adjacent line.

Advances in fabrication technology have permitted an increase in memory array density and a decrease in polysilicon wordline pitch. Unfortunately, the design rules for the metal lines do not permit a corresponding decrease in the pitch of the metal lines, particularly as 0.18 μm technology has come to the fore. Techniques such as a boosted dual wordline design scheme have been used to relax the metal design rule and improve the circuit yield. However, such designs require additional sub-wordline drivers and drive lines. Therefore, memory array wordline density is limited by the metal pitch.

The narrow pitch required of metal level lines formed in a single metal level limits their practical width and thereby limits their resistivity. By stitching the polysilicon wordlines alternatively to two levels of metallization, the pitch can be doubled. Metal lines are formed in two metallization levels. The pitch on each metallization level is twice the pitch as compared to when only a single metallization level is used. Doubling the pitch allows, not only relaxation of the design rule, but also permits broadening large portions of the lines on each level, thereby lowering their resistance.

Many modern DRAMs avoid wordline strapping entirely in order to avoid tight metal pitches in the array. Instead they rely on splitting the wordlines into many individually driven sections called sub-wordlines. These sub-wordlines are short enough (e.g. 256 to 1024 cells) so that they do not require straps to achieve sufficient speed. However, the individual drivers occupy valuable chip area. It is therefore desirable to have as many cells as possible on a given sub-wordline.

Another difficulty that has arisen with the ever-increasing size and density of memory arrays is the increased coupling capacitance between signal lines, such as wordlines and bitlines. Coupling noise is very sensitive to scaling and is considered a significant obstacle to achieving reliable high-speed and high-density memory arrays. One technique used to balance the effects of the narrow packing of the signal lines is to "twist" them by interconnecting to different metal lines over their length. Various twisting configurations exist such that each wordline follows an identical path over its length, and is exposed to the same inter-line coupling effects. No arrangement has previously been proposed that permits both multilevel wordline strapping, and wordline twisting.

Therefore, there is a need for a wordline layout that provides fast wordline access while increasing the wordline packing density and reducing capacitive coupling effects.

SUMMARY OF THE INVENTION

The object of the present invention is to mitigate or obviate at least one disadvantage of previous strap layouts. In particular, it is an object of the present invention to provide a densely packed twisted signal line arrangement in a semiconductor memory array, such as a DRAM memory array.

In a first aspect, there is provided a wordline strapping arrangement for a semiconductor memory array. A plurality of wordlines are formed in a polysilicon layer of the semiconductor memory array, and conductive stitches are formed in a first conductive layer overlaying the polysilicon layer. The stitches have a predetermined configuration in each of successive stitching regions, and are coupled to the plurality of wordlines in each of the successive stitching regions, to provide an effective twisting of the plurality of wordlines such that the physical characteristics of the wordlines are balanced over their length. At least one bypass strap is formed in a second conductive layer superjacent the polysilicon layer. The bypass strap is coupled to successive ones of the stitches in each successive stitching region. Primary straps are formed in a third conductive layer superjacent the polysilicon layer. The primary straps in this third conductive layer are coupled, in each of the successive stitching regions, to the stitches not coupled to the bypass strap.

According to a presently preferred embodiment, there are four successive stitching regions. The first conductive layer is adjacent the polysilicon layer, the third conductive layer overlays the first conductive layer, and the second conductive layer overlays the third conductive layer. Strap stitches are formed in a fourth conductive layer, interposed between the second and third conductive layers, to provide interconnections between the primary straps and the at least one bypass strap in each successive stitching region. In this manner, each wordline can be coupled, in turn, to the bypass strap. In combination with the interconnection of the stitches to the primary straps, this coupling of each wordline to the bypass strap and the primary straps form a balanced twisted logical signal line for each wordline. Preferably, the primary straps occupy substantially the same pitch as the wordlines. For example, where there are three primary straps, and one bypass strap, the three primary straps can occupy the same pitch as four wordlines.

Other aspects and features of the present invention will become apparent to those ordinarily skilled in the art upon review of die following description of specific embodiments of the invention in conjunction with the accompanying figures.

BRIEF DESCRIPTION OF THE DRAWINGS

Embodiments of the present invention will now be described, by way of examples only, with reference to the attached Figures, wherein:

FIG. 2 is a layout of polysilicon wordlines according to the embodiment of FIG. 1;

FIG. 3 is a metal-2 layout according to the embodiment of FIG. 1;

FIG. 4 is a metal-3 layout according to the embodiment of FIG. 1;

FIG. 5 is a metal-2/metal-3 layout according to the embodiment of FIG. 1;

FIG. 6 is a metal-4 layout according to the embodiment of FIG. 1;

FIG. 7 is a metal-3/metal-4 layout according to the embodiment if FIG. 1;

FIG. 9 is a metal-1/polysilicon layout according to the embodiment of FIG. 8b; and FIG. 10 is a metal-1/metal-2 layout according to the embodiment of FIG. 8b.

DETAILED DESCRIPTION

Generally, the high density wordline packing and strapping arrangement of the present invention is achieved by twisting the wordlines, and by routing at least one bypass wordline strap in a conductive layer that lies in a plane distinct from a conductive layer where primary wordline straps are laid out. Stitches in other conductive layers provide the twisting and interconnect the primary an bypass straps. While the following embodiment of the invention refers to metal straps, such as aluminum straps, it will be understood by those of skill in the art that the conductive material chosen for the various conductive layers is not limited to metal, and the invention can include, for example, conductive polysilicon straps.

Figure 1:
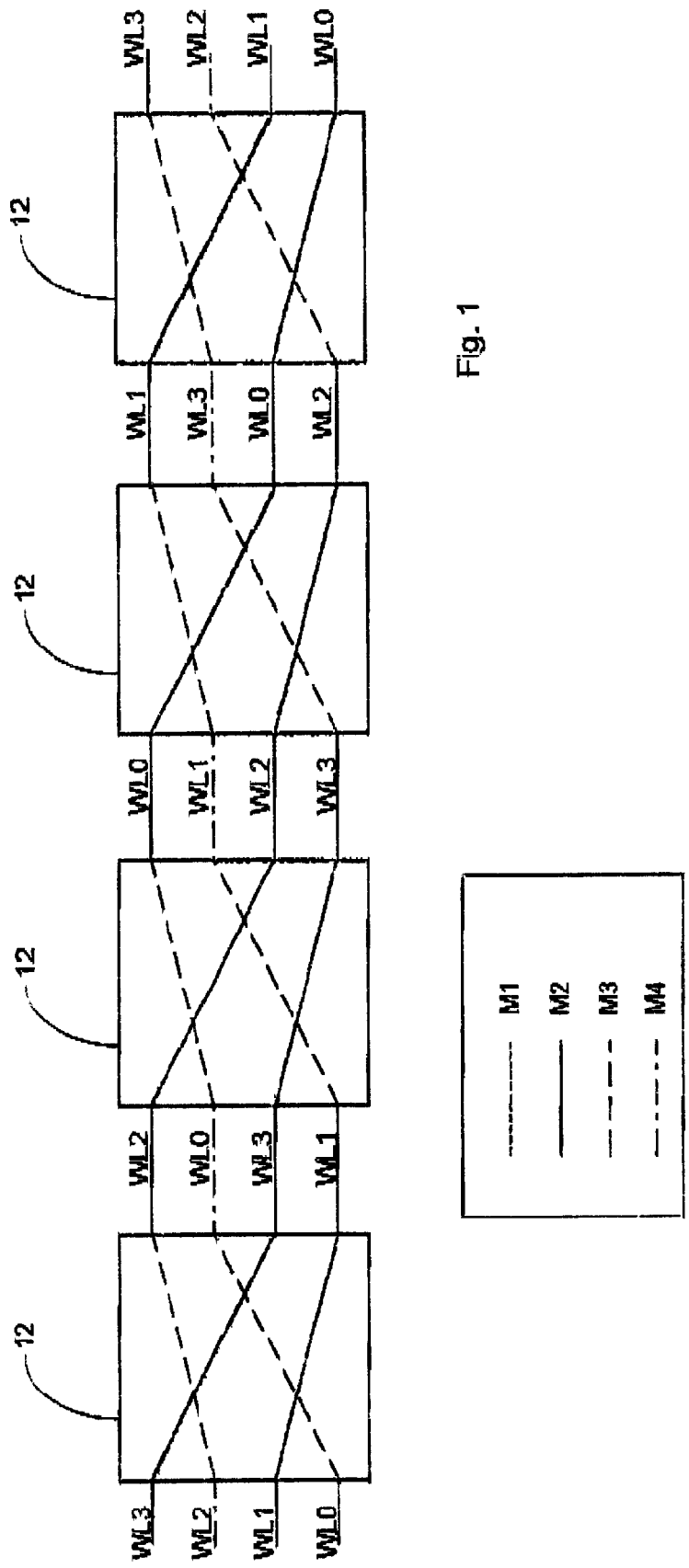
FIG. 1 is a schematic representation of a wordline strapping arrangement according to an embodiment of the present invention.
Figure 8A:
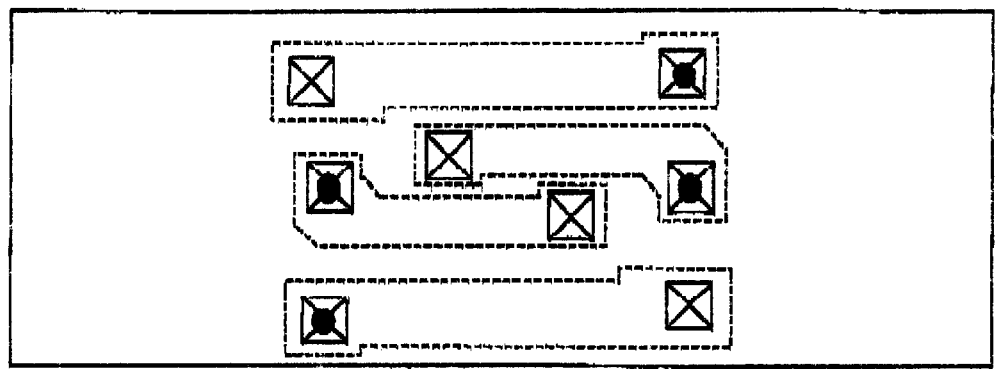
FIGS. 8a–8d are metal-1 stitch layouts for successive stitching regions according to the embodiment of FIG. 1.
Figure 8B:
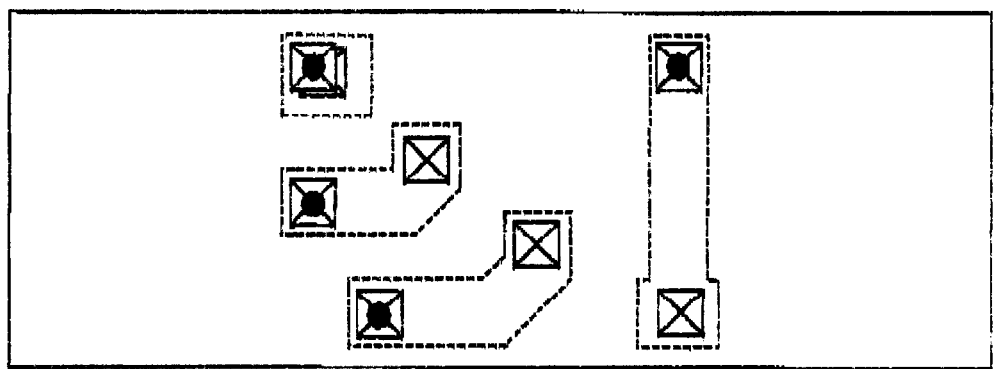
Figure 8C:
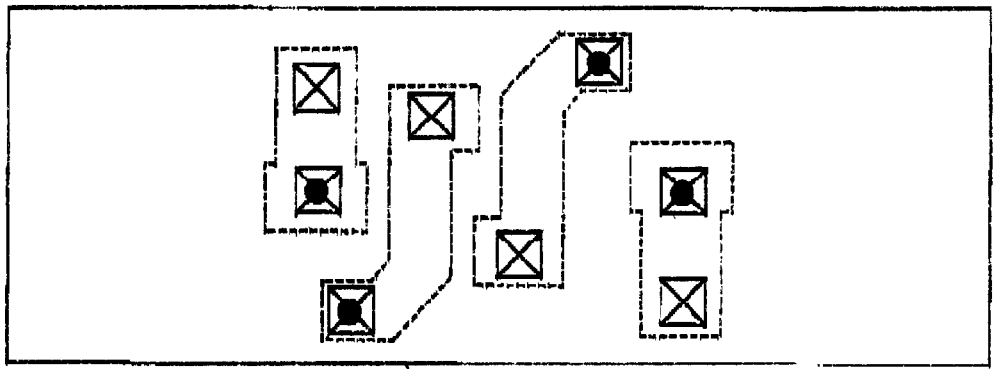
Figure 8D:
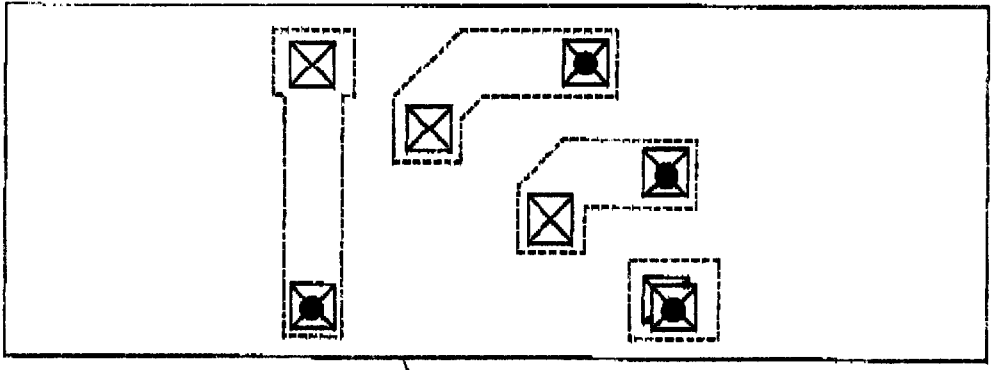

FIG. 1 illustrates a presently preferred embodiment of the wordline strapping arrangement of the present invention. Wordline strapping is obtained by routing three primary metal-2 (M2) wordline straps in the same space as four polysilicon wordlines, and routing a fourth wordline strap in a metal-4 (M4) layer over the primary M2 wordline straps. Wordlines are indicated by WL0, WL1, WL2, and WL3, respectively. The level of the metal straps and stitches are detailed in the legend accompanying the drawing. In each of successive stitching regions 12, strap stitches in metal-3 (M3) connect the M2 primary wordline straps to the M4 wordline straps, and stitches in metal-1 (M1) connect the M2 primary wordline straps to the polysilicon wordlines (not shown). Therefore, contact spacing and metal pitch limitations are relaxed to allow four metal wordline straps to occupy the same pitch as four polysilicon wordlines. The wordlines are twisted to keep them fully balanced and to minimise coupling between wordline straps and neighbouring power and signal lines. Hence, a smaller memory cell array can be formed according to the wordline packing arrangement of the present invention. The present embodiment uses continuous wordlines with all wordlines stitched at all strap connection points. The areas between stitching regions 12 are active memory cell areas, where the polysilicon wordlines are coupled to memory cells.

As shown, each logical wordline signal line is routed, through its respective strapping, over an identical physical path over its length. The wordline straps change positions in each stitching region 12. For example, moving from left to right and designating the M2 straps as first, second and third in order from the bottom, the physical position of the WL0 signal line is successively transposed from the first M2 sap, to the M4 strap, to the third M2 strap, to the second M2 strap, and finally returns to the first M2 strap. The position of WL1 is successively transposed from the second M2 strap, to the first M2 strap, to the M4 strap, to the third M2 strap, and finally returns to the second M2 strap.

FIGS. 2–10 show layouts for the various layers in the stitching regions 12. Different line styles are used for each metal layer, as detailed in the legend. The polysilicon wordlines are shown hatched. Interlevel connections between adjacent layers are indicated by crossed boxes. A cross indicates that a physical/electrical contact is formed between the layer shown and the next lower layer. A cross with a dot indicates that the contact is between the layer shown and the next higher layer. In those drawings where two layers are shown, the connections are those of the upper layer (e.g. FIG. 5 shows the M2 and M3 layouts; the connections are from the viewpoint of the M3 layer).

FIG. 2 shows the layout of the polysilicon wordlines. The physical wordlines are parallel to each other, and are connected to stitches in M1 at the connection points shown. The M1 stitches couple the polysilicon wordlines to M2 straps, which are shown in FIG. 3. For the sake of clarity, the connection points of the M2 straps are not shown in FIG. 3, but are, instead shown in the M2/M3 layout of FIG. 5 and the M1/M2 layout of FIG. 10. The four polysilicon wordlines are logically, or effectively, twisted by the three twisted M2 lines and the segmented M4 line. The M3 strap straps are shown in FIGS. 4, 5 and 7. FIGS. 4 and 6 show the M3 and M4 layouts, respectively. Additional M4 lines can be used for power or signal routing.

The sequence of M1 stitch configurations shown in FIGS. 8a–8d are used in each successive stitching region 12 to couple the twisting M2 lines to their respective logical polysilicon wordline. As an example, FIGS. 9 and 10 show the interconnection of the M1 stitches of FIG. 8b to the polysilicon and M2 layers, respectively.

In an alternative embodiment, wordline straps can be twisted using two M2 lines and two M4 lines, or using other combinations, other metal layers, or other conductive materials. The present invention is not limited to forming straps in two conductive layers, but can be extended to three or more layers, depending on the particular memory array configuration, processing advances, and number of wordlines. The same strap twisting architecture can be used for other wordline arrangements, including those where the wordlines are not continuous and only a subset of wordlines is stitched at any given strap point. This may include arrangements where the wordlines are cut and not untwisted at stitching areas.

The twisted wordline strap architecture of the present invention eliminates the metal pitch and contact spacing limitations to high wordline packing density, to achieve a smaller memory cell may. The twisted wordline strap arrangement of the present invention allows multiple metal layers to be used for wordline straps in a twisted wordline architecture. Other advantages of the present invention include the ability to use more vias for stitching than is conventionally possible. The wordline strapping arrangement provides fully balanced wordline straps. Over their length, each wordline is routed in the same manner in each of the layers. The present invention also results in an undisturbed wordline sequence at either end of the strapping region. Coupling between wordline straps and neighbouring power and signal lines is minimised, and all polysilicon wordlines can be strapped at every strap point. There is also more immunity to noise than in previous wordline architectures, and propagation delays are better matched.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A wordline strapping arrangement for a semiconductor memory array, comprising:

a plurality of wordlines formed in a polysilicon layer of the semiconductor memory array;

stitches formed in a first conductive layer overlaying the polysilicon layer, the stitches having a predetermined configuration in each of successive stitching regions, and being coupled to the plurality of wordlines in each of the successive stitching regions to provide an effective twisting of the plurality of wordlines such that the plurality of wordlines are balanced over their length;

at least one bypass strap formed in a second conductive layer superjacent the polysilicon layer, each at least one bypass strap being coupled to one of the stitches in each successive stitching region;

primary straps formed in a third conductive layer superjacent the polysilicon layer, the primary straps in the third conductive layer being coupled, in each of the successive stitching regions, to separate ones of the stitches not coupled to the at least one bypass strap.

2. The wordline strapping arrangement of claim 1, wherein the successive stitching regions include four successive stitching regions.

3. The wordline strapping arrangement of claim 2, wherein the first conductive layer is adjacent the polysilicon layer.

4. The wordline strapping arrangement of claim 3, wherein the third conductive layer overlays the fast conductive layer, and the second conductive layer overlays the third conductive layer.

5. The wordline strapping arrangement of claim 4, wherein strap stitches are formed in a fourth conductive layer, interposed between the second and third conductive layers, to provide interconnections between the primary straps and the at least one bypass strap in each successive stitching region.

6. The wordline strapping arrangement of claim 5, wherein the interconnection of the at least one bypass strap and the primary straps form a twisted logical signal line for each of the plurality of wordlines.

7. The wordline strapping arrangement of claim 1, wherein the primary straps occupy substantially the same pitch as the plurality of wordlines.

8. The wordline strapping arrangement of claim 8, wherein there are three primary straps and four wordlines.

9. The wordline strapping arrangement of claim 1, wherein the semiconductor memory array is a DRAM memory array.

* * * * *

UNITED STATES PATENT AND TRADEMARK OFFICE
CERTIFICATE OF CORRECTION

PATENT NO. : 6,611,062 B2  
DATED : August 26, 2003  
INVENTOR(S) : Wlodek Kurjanowicz It is certified that error appears in the above-identified patent and that said Letters Patent is hereby corrected as shown below:

<u>Title page,</u>  
Item [57], ABSTRACT,  
Line 3, delete "wordline" and insert therefor -- wordlines --.  
Line 9, at the end of the line delete "the" and insert -- them --.

<u>Column 6,</u>  
Line 31, delete "fast" and insert therefor -- first --.

Signed and Sealed this

Ninth Day of March, 2004

JON W. DUDAS  
*Acting Director of the United States Patent and Trademark Office*